US007361523B2

United States Patent
Sooriakumar et al.

(10) Patent No.: US 7,361,523 B2
(45) Date of Patent: Apr. 22, 2008

(54) THREE-AXIS ACCELEROMETER

(75) Inventors: Kathirgamasundaram Sooriakumar, Singapore (SG); Kitt-Wai Kok, Singapore (SG); Bryan Keith Patmon, Singapore (SG)

(73) Assignee: Sensfab Pte Ltd, The Cavendish (SG)

( * ) Notice: Subject to any disclaimer, the term of this patent is extended or adjusted under 35 U.S.C. 154(b) by 0 days.

(21) Appl. No.: 10/568,514

(22) PCT Filed: Aug. 11, 2004

(86) PCT No.: PCT/SG2004/000240

§ 371 (c)(1),
(2), (4) Date: Oct. 26, 2006

(87) PCT Pub. No.: WO2005/017535

PCT Pub. Date: Feb. 24, 2005

(65) Prior Publication Data

US 2007/0059857 A1    Mar. 15, 2007

(30) Foreign Application Priority Data

Aug. 14, 2003 (SG) ............................. 200304840

(51) Int. Cl.
*H01L 21/00* (2006.01)

(52) U.S. Cl. .................. 438/52; 438/50; 73/514.01; 257/E21.023

(58) Field of Classification Search .......... 438/50, 438/51, 52, 53; 257/415; 73/514.01, 514.02
See application file for complete search history.

(56) References Cited

U.S. PATENT DOCUMENTS 4,934,190 A * 6/1990 Lee .................. 73/204.26

5,817,942 A    10/1998 Greiff
6,845,670 B1 *  1/2005 McNeil et al. ........... 73/514.32

FOREIGN PATENT DOCUMENTS

WO    WO 02/057180 A2    7/2002
WO    WO 03/065050 A2 *  8/2003

OTHER PUBLICATIONS

Qu, et al., "Fabrication of a 3D Differential-Capacitive Acceleration Sensor by UV-LIGA", *Sensors and Actuators*, vol. 77, pp. 14-20 (1999).
Matsumoto, et al., "Three-Axis SOI Capacitive Accelerometer With PLL C-V Converter", *Sensors and Actuators*, vol. 75, pp. 77-85 (1999).

* cited by examiner

*Primary Examiner*—Michael Lebentritt
*Assistant Examiner*—Reema Patel
(74) *Attorney, Agent, or Firm*—Abelman, Frayne & Schwab

(57) ABSTRACT

The invention comprises a method of fabricating a three-axis accelerometer. A first wafer having a first and a second major surface provided with etching at least two cavities in the first major surface of the first wafer and patterning metal onto the first major surface of the first wafer to form electrical connections for a third accelerometer. A second wafer, etching a portion of a first major surface of the second wafer and bonding the first major surface of the first wafer to the first major surface of the second wafer. The etching and bonding of the surfaces deposit and pattern metallizating, and deposit and pattern a masking layer on the second major surface of the second wafer, defining the shape of a first, a second and the third accelerometer. The first and second accelerometers are formed over the cavities etched in the first major surface of the first wafer. Etching the second major surface of the second wafer to form the accelerometer where the first and second accelerometers each include at least two independent sets of the beams. The masking layer from the second major surface of the second wafer is then removed.

20 Claims, 6 Drawing Sheets

THREE-AXIS ACCELEROMETER

FIELD OF INVENTION

The invention relates to microelectromechanical devices and in particular to capacitive microelectromechanical accelerometers able to detect acceleration along three orthogonal axes.

BACKGROUND

Microelectromechanical accelerometers are currently being manufactured for a number of applications including vehicle airbag and inertial navigation and guidance systems. For applications such as vehicle airbags the accelerometers need to be both accurate and inexpensive.

Microelectromechanical accelerometers are formed on a wafer using fabrication process steps similar or identical to those used in integrated circuit fabrication. Microelectromechanical devices combine electrical and mechanical functionality into one device. The fabrication of microelectromechanical devices is generally based on the making and processing of alternate layer of polycrystalline silicon (polysilicon) and a sacrificial material such as silicon dioxide ($SiO_2$) or a silicate glass. The polysilicon layers are built up and patterned layer by layer to form the structure of the device. Once the structure is completed the sacrificial material is removed by etching to release the polysilicon members of the microelectromechanical device for operation. The removal of sacrificial material in some microelectromechanical accelerometers includes using an isotropic release etch to release beams of the accelerometer from the bottom surface of the accelerometer. This release etch has the disadvantage of etching away part of the beams and reducing the proof mass and effectiveness of the accelerometer.

The type of accelerometer fabrication described above provides an accelerometer that is co-planar with the plane of the wafer. Using this method two accelerometers can be fabricated in one wafer to measure acceleration in two orthogonal directions, both co-planar with the plane of the wafer. A different accelerometer design is required for an accelerometer to measure acceleration perpendicular to the plane of the wafer.

SUMMARY OF INVENTION

In broad terms the invention comprises a method of fabricating a three-axis accelerometer including the steps of providing a first wafer of insulating material having a first major surface and a second major surface, etching at least two cavities in the first major surface of the first wafer, patterning metal onto the first major surface of the first wafer to form electrical connections for a third accelerometer, providing a second wafer of semiconducting material, etching a portion of a first major surface of the second wafer, bonding the first major surface of the first wafer to the first major surface of the second wafer so that at least part of the etched portion of the second wafer is above at least part of the metal on the first wafer, depositing and patterning metallization on the second major surface of the second wafer, depositing and patterning a masking layer on the second major surface of the second wafer defining the shape of a first accelerometer, a second accelerometer and the third accelerometer so that the first and second accelerometers will be formed over the cavities etched in the first major surface of the first wafer, etching the second major surface of the second wafer to form the accelerometer where the first and second accelerometers each include at least two independent sets of the beams, and removing the masking layer from the second major surface of the second wafer.

Preferably the wafer is an insulating material. Ideally the wafer is formed from glass, borosilicate glass, or another equivalent material.

Preferably the etch step used to form cavities in the first major surface of the first wafer is an anisotropic etch.

Preferably the metal deposited on the wafer is chromium/gold. Alternatively any other suitable metal, metal alloy or mixture may be used.

Preferably the step of patterning metal on the first major surface of the first wafer forms a first electrical connection for the third accelerometer.

Preferably the step of patterning metal on the first major surface of the first wafer forms at least one metal plate on either side of the first electrical connection to form a capacitor on each side of the first electrical connection of the third accelerometer.

Preferably the second wafer is formed of silicon.

Preferably the second major surface of the second wafer is thinned to a required thickness after the step of bonding the first wafer to the second wafer.

Preferably bonding between the wafers is performed by an anodic, eutectic or thermocompression bond.

Preferably the metal deposited on the second major surface of the second wafer is chromium/gold. Alternatively any suitable metal, metal alloy or mixture may be used.

Preferably the metal deposited on the second major surface of the second wafer forms electrical connections for the first and second accelerometers.

Preferably each set of beams is anchored to the wafer.

Preferably one set of beams includes means to allow the beams to move with side to side motion from one end of the beams. Ideally the means to allow the beams to move is a spring or tether means.

Preferably the method of fabricating the accelerometer further includes the step of masking the wafer before the step of etching the wafer.

Preferably the method of fabricating the accelerometer further includes the step of patterning the mask using lithography processes.

BRIEF DESCRIPTION OF DRAWINGS

A preferred form system and method of the invention will be further described with reference to the accompanying figures by way of example only and without intending to be limiting, wherein.

DETAILED DESCRIPTION OF PREFERRED FORMS

Figure 1:
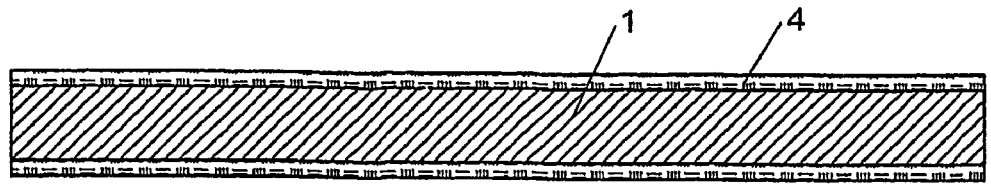
FIG. 1 shows a first wafer with a masking layer.

FIG. 1 shows a wafer 1 of electrically insulating material. The wafer is covered by masking layer 4 on its first major surface. Wafer 1 may be formed from any suitable electrically insulating material such as glass, Pyrex or other materials with similar properties. Wafer 1 may also be covered by a masking layer on its second major surface.

An alternative wafer arrangement may be provided instead of wafer 1 where the wafer is formed from electrically conducting or semiconducting material such as silicon. In this arrangement wafer has electrically insulating layer deposited on its first major surface. Suitable materials for the insulating layer include oxide, nitride, PSG, glass frit, etc.

Figure 2:
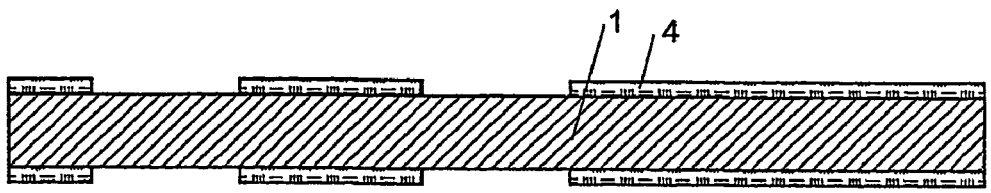
FIG. 2 shows the first wafer with the masking layer patterned.

The first major surface of the wafer 1 or the insulating layer 3 is deposition with a masking layer 4. The masking layer is patterned with marks for cavities to be formed in the wafer 1 or insulating layer and wafer for two of the accelerometers. The masking layer may also be patterned with marks for alignment purposes useful for later stage of the process. The masking layer may be formed from chrome or any other suitable material, for example polysilicon. FIG. 2 shows the masking layer once it has been patterned. Patterning of the masking layer may use lithography processes as are well known to those skilled in the art and commonly used in the wafer fabrication industry.

Figure 3:
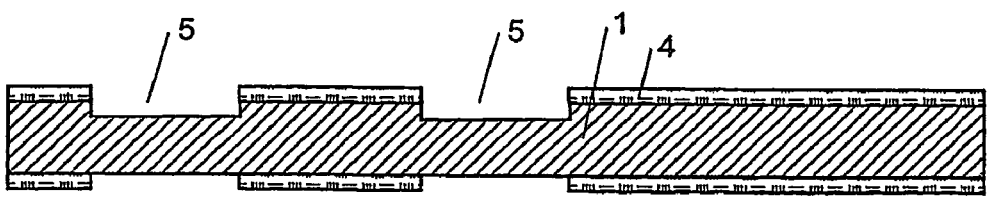
FIG. 3 shows the first wafer with cavities etched into a first major surface of the wafer.

FIG. 3 shows cavities 5 etched into the wafer 1. Etching may be performed using any suitable process such as anisotropic etching. After the cavities have been etched the remaining masking layer is removed from the first major surface.

Figure 4:
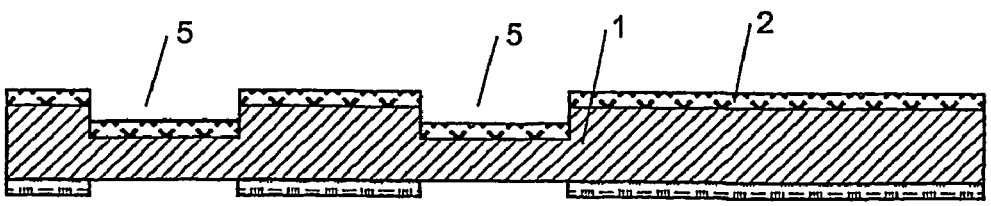
FIG. 4 shows the first wafer with metal formed over the first major surface.
Figure 5:
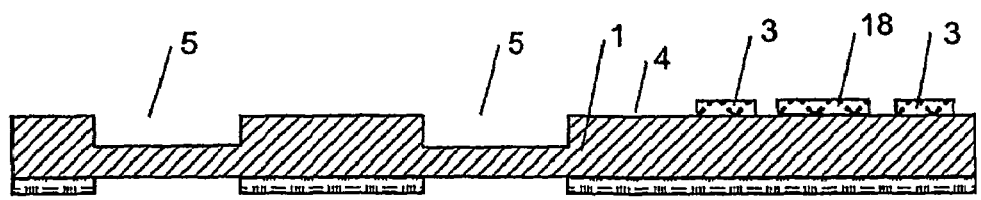
FIG. 5 shows the first wafer with metal patterned and etched on the first major surface.

FIG. 4 shows metal deposited on the first major surface of wafer 1. The metal may be any suitable metal. In the preferred embodiment the metal is a mixture of chromium and gold. FIG. 5 shows the patterning and etching of the metal to form electrical connections 18 and plates 3 for the third accelerometer.

Figure 6:
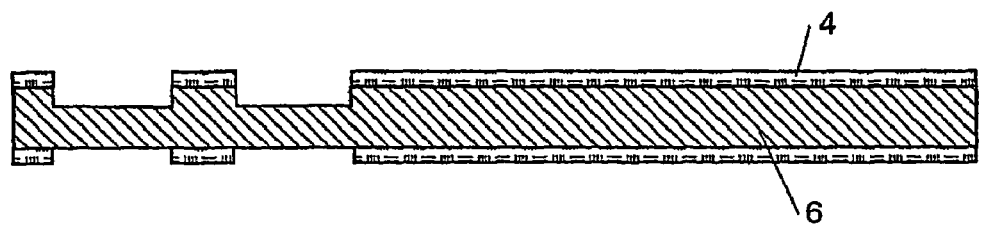
FIG. 6 shows the second wafer with cavities patterned and etched on the first major surface.

FIG. 6 shows the first masking, patterning and etching step for the second wafer 6. Wafer 6 is formed from semiconducting material such as silicon. As can be seen in FIG. 6 (and more clearly in FIG. 15), two cavities are etched from a first major surface of the silicon with a higher area 17 formed between the two cavities. The masking layer is then removed.

Figure 7:
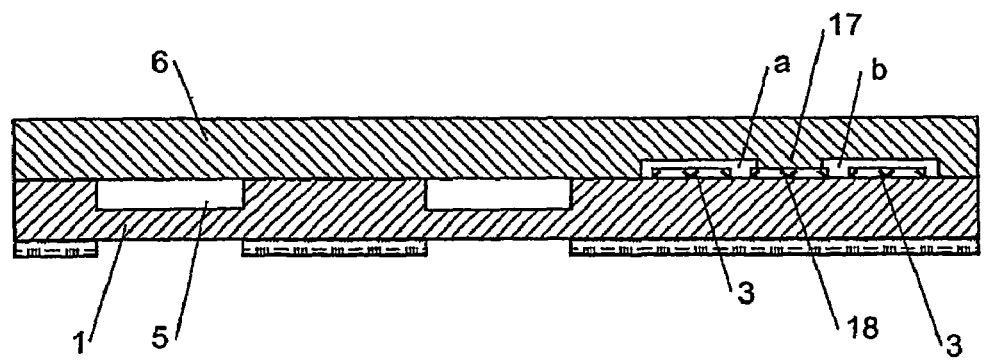
FIG. 7 shows the two wafers bonded together at the first major surfaces of each wafer.
Figure 8:
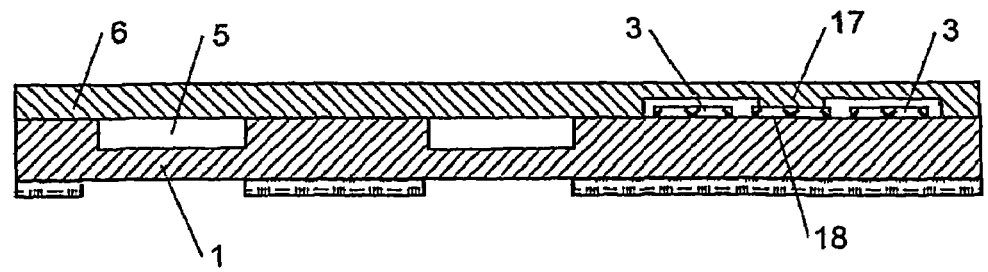
FIG. 8 shows the two wafers bonded together where the second major surface of the second wafer has been thinned.

Following this the first major surface of wafer 6 is bonded to the first major surface of wafer 1 as shown in FIG. 7 so that high area 17 of wafer 6 is bonded to metal portion 18. Any suitable bonding technique may be used to bond the two layers together. For example a suitable technique may be anodic, eutectic or thermocompression bonding. Alternatively any other suitable technique may be used. If the wafer 6 is thicker than the thickness required for the sensor the second major surface of wafer 6 is thinned to the required thickness as shown in FIG. 8. Techniques for thinning the second major surface of wafer 6 include wet chemical etching, backgrinding, lapping, chemical-mechanical polishing or a combination of these and other techniques.

FIG. 8 shows wafer 6 and wafer 1 bonded together with the top layer at the required thickness. The thickness of wafer 6 determines the thickness of the beams of the in-plane accelerometers as well as the thickness of the legs of the third accelerometer. The capacitance of the in-plane accelerometers formed by the process is also related to the thickness of the beams. The sensitivity of the in-plane accelerometers to acceleration forces is also related to the thickness of the beams. The thicker the beams the bigger the capacitive charge for a given displacement of the beams. Another effect of thicker beams is a larger seismic or proof mass of the sensor. This also increases the sensitivity of the sensor to low g-forces.

Figure 9:
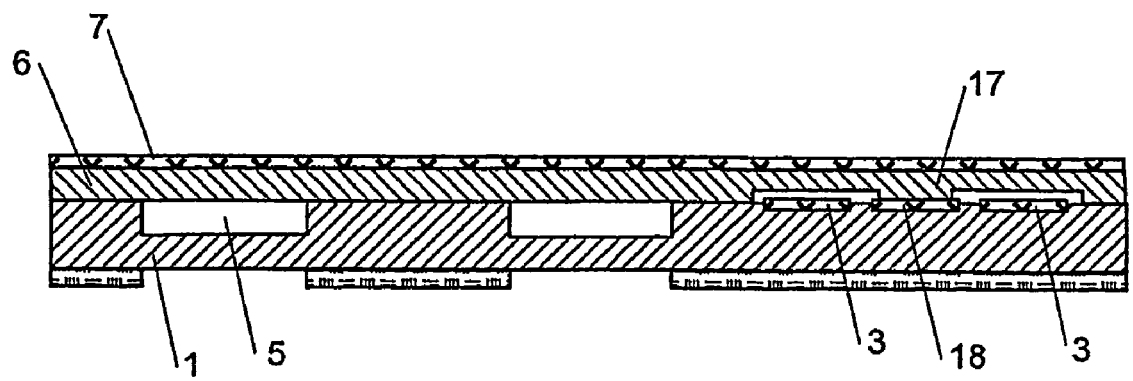
FIG. 9 shows the two wafers bonded together where metal has been formed on the second major surface of the second wafer.
Figure 10:
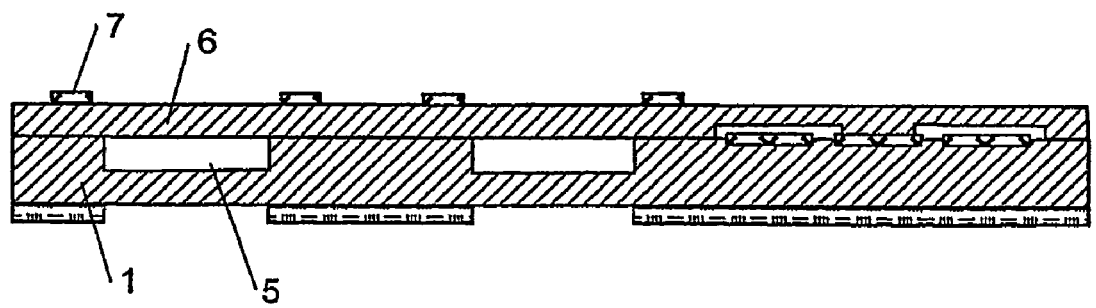
FIG. 10 shows the two wafers bonded together where the metal on the second major surface of the second wafer has been patterned.

Following the step of bonding the wafer 1 and the wafer 6 and the step of thinning wafer 6 (if necessary), metallization 7 is deposited onto the second major surface of wafer 6 as shown in FIG. 9. Metallization is used to form electrical connections to further electronics that may be connected to the sensor and in particular the electrical connection to the first and second accelerometers. FIG. 10 shows the patterning of metallization 7 to form the electrical connections.

Figure 11:
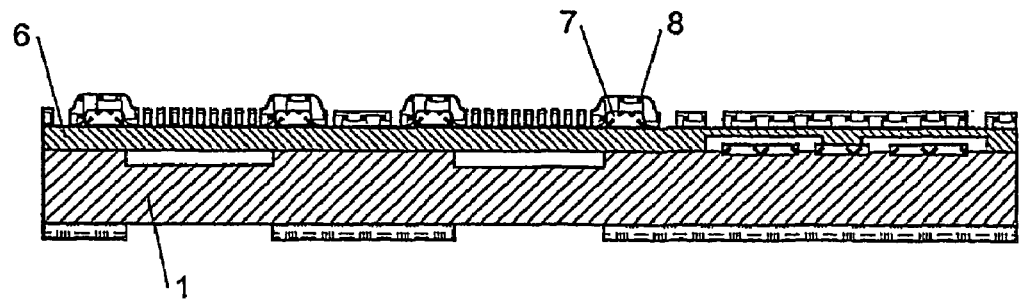
FIG. 11 shows the two wafers bonded together with a masking layer patterned on the second major surface of the second wafer.

The next step in the process is to deposit a masking layer 8 over the metallization 7 and wafer 6. Again the masking layer 8 is patterned using a suitable process such as a lithography process. As can be seen in FIG. 11 the masking layer has been patterned to form the sensor structures of each of the accelerometers. For the two in-plane accelerometers the sensor structures of the accelerometers include two comb like structures, one on each side of the cavity and a central beam with a comb like structure on each side. Each of the comb like structures extending from the central beam intermeshes with one or the other comb like structures (shown in more detail in FIG. 14). However other suitable structures may be patterned onto the mask.

The third accelerometer detects motion along axis 19 and has at least one leg projecting from either side of centre column 17. When no acceleration is present along axis 19 the legs of the third accelerometer are coplanar with wafer 1. When acceleration occurs along axis 19 the accelerometer tilts, increasing the capacitance between the metal and the leg(s) on one side of column 17 and decreasing the capacitance between the metal and the leg(s) on the other side of the accelerometer.

Figure 12:
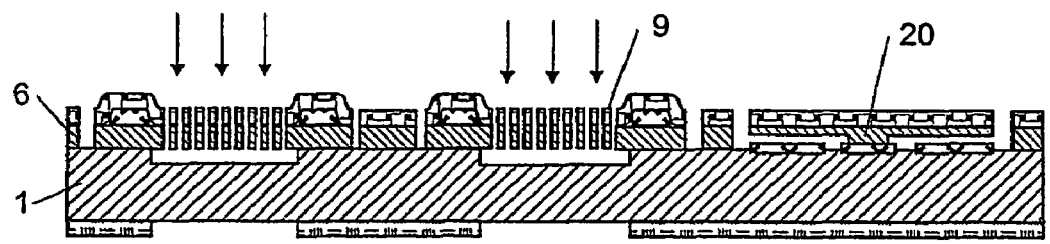
FIG. 12 shows the two wafers bonded together and with the second major surface of the second wafer etched to form the three accelerometers.

Following the patterning of the mask the mask is then etched as shown in FIG. 12 to produce the structure of the in-plane accelerometers suspended over cavities 5 in wafer 1 and to free the legs of the third accelerometer. This etch step may be performed by anisotropic etch. The step of forming cavities 5 in wafer 1 and cavities in wafer 6 before bonding wafer 6 to wafer 1 removes the need to etch underneath the beams of any of the accelerometers to release them from the wafer by isotropic etching. This avoids the problems associated with isotropic etching including that isotropic etching consumes much of the thickness of the beams thereby reducing the sensitivity and capacitance of the sensor.

Figure 13:
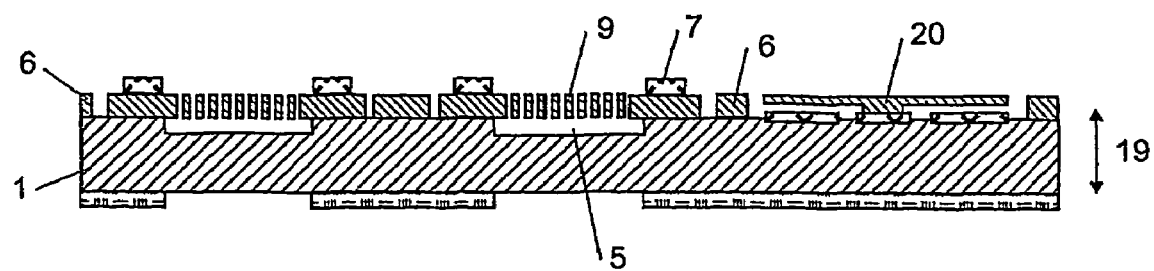
FIG. 13 shows the accelerometers with the masking layer removed.

The final step in the process is performing an etch back to remove the unwanted masking layer 9 from the top of the sensor as shown in FIG. 13. A further optional step is to provide a passivation layer over the metallization. The sensor is now functional and can be packaged on to a wafer level to enable dicing the wafers into individual dies.

Figure 14:
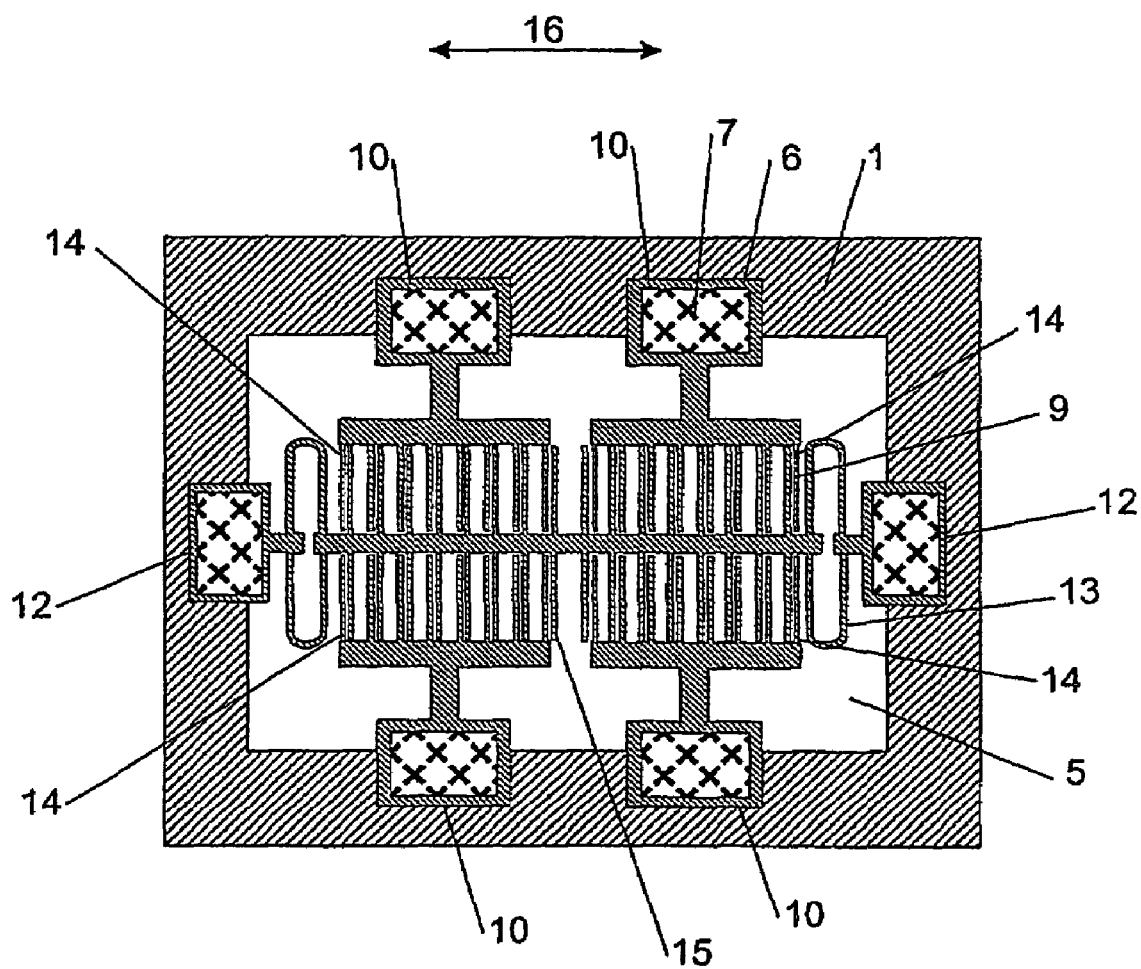
FIG. 14 is a plan view of one of the accelerometers.

FIG. 14 is a top view of an in-plane accelerometer formed using the method of the invention. As can be seen in FIG. 14 the accelerometer structure is suspended over cavity 5. The sensor structure comprises four sets of fixed capacitive plates anchored to wafer 1 at anchor blocks 10. Each set of capacitive plates includes a set of beams attached at one end to a wider beam in a comb arrangement. The wider beam is then attached to the anchor block. A second set of capacitive plates is shown at 15. This set of capacitive plates has a central wider beam with smaller beams extending at right angles from both sides of the wider beam. The wider beam of this set of capacitive plates is tethered to anchors 12 by spring means 13. The spring means 13 allows capacitive plates 15 to move in the directions indicated by arrow 16. Any suitable means that allows movement of the capacitive plates in one direction may be used.

Each anchor block 10 or 12 includes an area 7 of metallization used for electrical contacts. The electrical contacts may also be provided at other area of the wafer connected to the anchor blocks 10 or 12. Although the anchor blocks all rest on the same wafer, the insulating properties of the bottom wafer keep the anchor blocks electrically insulated from one another. Cavity 5 under the structure, in the bottom wafer, allows the structure to be suspended and freely react to acceleration forces parallel to the wafer surface. This allows a capacitance change caused by a force displacing the moving plates relative to the fixed plates to be sensed.

Figure 15:
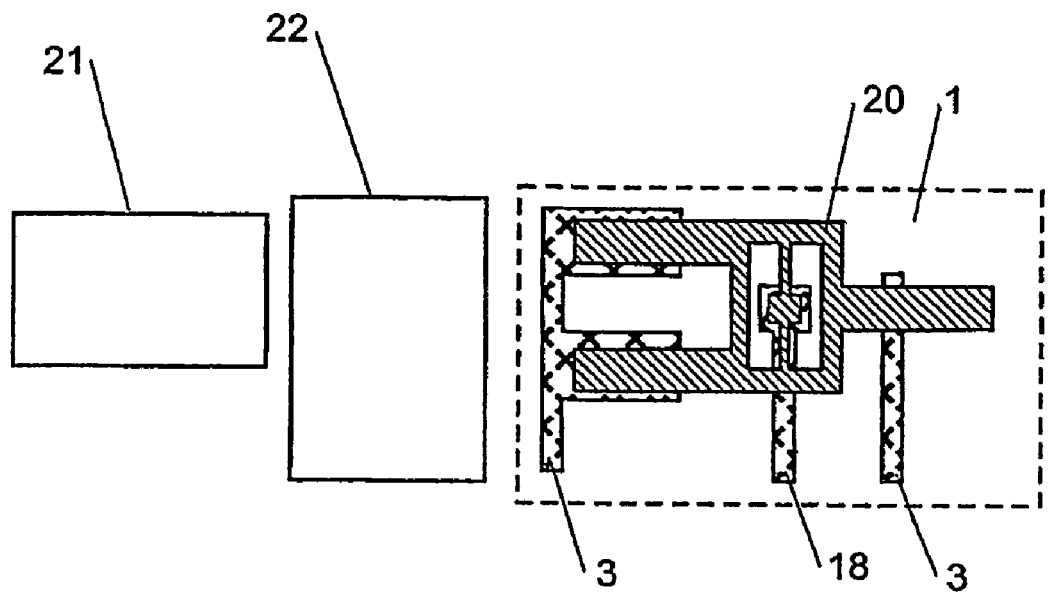
FIG. 15 is a plan view showing the third accelerometer.

FIG. 15 is a further plan view of the three axis accelerometer. Boxes 21 and 22 represent the in-plane accelerometers shown in more detail in FIG. 14. The two in-plane accelerometers are positioned at right angles to each other so as to assess acceleration in two directions within the plane of the three axis accelerometer. The third accelerometer measures acceleration that is not co-planar with the plane of the three axis accelerometer. For example the third accelerometer will be the only accelerometer to measure acceleration perpendicular to the plane of the sensor. The layout shown in this Figure should not be seen as limiting. It should also be noted that more than three accelerometers may be provided.

As can be seen in FIG. 15 the metallization forms an electrical connection 18 to the centre of the third accelerometer with further electrical connections 3 provided under the legs of the accelerometer. The accelerometer shown in FIG. 15 has one leg on a first side of the centre and two legs on the other side of the centre. In other embodiments the accelerometer may have different numbers of legs on each side of the centre. Power is supplied to the legs through the centre and forms a capacitor with electrical connections 3.

Figure 16:
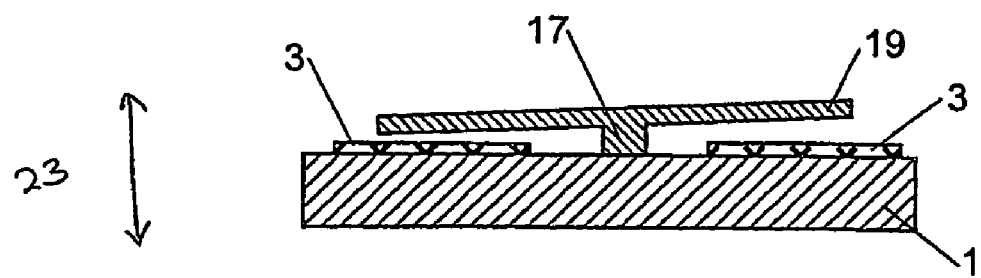
FIG. 16 is a side view showing the third accelerometer in use.

As shown in FIG. 16 when acceleration occurs, for example along axis 23, the third accelerometer will tilt towards one or other of the electrical connection 3 decreasing the capacitance on that side of the accelerometer and increasing the capacitance on the other side of the accelerometer.

The foregoing describes the invention including preferred forms thereof. Alterations and modifications as will be obvious to those skilled in the art are intended to be incorporated within the scope hereof as defined in the accompanying claims.

The invention claimed is:

1. A method of fabricating a three-axis accelerometer including the steps of;
   providing a first wafer of insulating material having a first major surface and a second major surface,
   etching at least two cavities in the first major surface of the first wafer,
   patterning metal onto the first major surface of the first wafer to form electrical connections for a third accelerometer,
   providing a second wafer of semiconducting material, etching a portion of a first major surface of the second wafer,
   bonding the first major surface of the first wafer to the first major surface of the second wafer so that at least part of the etched portion of the second wafer is above at least part of the metal on the first wafer,
   depositing and patterning metallization on the second major surface of the second wafer,
   depositing and patterning a masking layer on the second major surface of the second wafer defining the shape of a first accelerometer, a second accelerometer and the third accelerometer so that the first and second accelerometers will be formed over the cavities etched in the first major surface of the first wafer,
   etching the second major surface of the second wafer to form the accelerometer where the first and second accelerometers each include at least two independent sets of the beams, and
   removing the masking layer from the second major surface of the second wafer.

2. A method of fabricating a three-axis accelerometer as claimed in claim 1 wherein the first wafer is an insulating material.

3. A method of fabricating a three-axis accelerometer as claimed in claim 2 wherein the first wafer is formed from glass.

4. A method of fabricating a three-axis accelerometer as claimed in claim 2 wherein the first wafer is formed from borosilicate glass.

5. A method of fabricating a three-axis accelerometer as claimed in claim 1 wherein the etch step used to form cavities in the first major surface of the first wafer is an anisotropic etch.

6. A method of fabricating a three-axis accelerometer as claimed in claim 1 wherein the metal deposited on the wafer is chromium/gold.

7. A method of fabricating a three-axis accelerometer as claimed in claim 1 wherein the step of patterning metal on the first major surface of the first wafer forms a first electrical connection for the third accelerometer.

8. A method of fabricating a three-axis accelerometer as claimed in claim 1 wherein the step of patterning metal on the first major surface of the first wafer forms at least one metal plate on either side of the first electrical connection to form a capacitor on each side of the first electrical connection of the third accelerometer.

9. A method of fabricating a three-axis accelerometer as claimed in claim 1 wherein the second wafer is formed of silicon.

10. A method of fabricating a three-axis accelerometer as claimed in claim 1 wherein the second major surface of the second wafer is thinned to a required thickness after the step of bonding the first wafer to the second wafer.

11. A method of fabricating a three-axis accelerometer as claimed in claim 1 wherein the step of bonding the wafers is performed by an anodic bond.

12. A method of fabricating a three-axis accelerometer as claimed in claim 1 wherein the step of bonding the wafers is performed by a eutectic bond.

13. A method of fabricating a three-axis accelerometer as claimed in claim 1 wherein the step of bonding the wafers is performed by a thermocompression bond.

14. A method of fabricating a three-axis accelerometer as claimed in claim 1 wherein the metal deposited on the second major surface of the second wafer is chromium/gold.

15. A method of fabricating a three-axis accelerometer as claimed in claim 1 wherein the metal deposited on the second major surface of the second wafer forms electrical connections for the first and second accelerometers.

16. A method of fabricating a three-axis accelerometer as claimed in claim 1 wherein each set of beams is anchored to the wafer.

17. A method of fabricating a three-axis accelerometer as claimed in claim 1 wherein one set of beams includes means to allow the beams to move with side to side motion from one end of the beams.

18. A method of fabricating a three-axis accelerometer as claimed in claim 17 wherein the means to allow the beams to move is a spring or tether means.

19. A method of fabricating a three-axis accelerometer as claimed in claim 1 further including the step of masking the wafer before the step of etching the wafer.

20. A method of fabricating a three-axis accelerometer as claimed in claim 1 further including the step of patterning the mask using lithography processes.

* * * * *